United States Patent
Azuma

(10) Patent No.: US 8,997,514 B2
(45) Date of Patent: Apr. 7, 2015

(54) AIR-CONDITIONING APPARATUS WITH A CONTROL UNIT OPERATING AS AN EVAPORATOR

(75) Inventor: Koji Azuma, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 834 days.

(21) Appl. No.: 13/255,184

(22) PCT Filed: Apr. 3, 2009

(86) PCT No.: PCT/JP2009/056937
§ 371 (c)(1),
(2), (4) Date: Sep. 7, 2011

(87) PCT Pub. No.: WO2010/113313
PCT Pub. Date: Oct. 7, 2010

(65) Prior Publication Data
US 2011/0315368 A1    Dec. 29, 2011

(51) Int. Cl.
*H05K 7/20* (2006.01)
*F25B 13/00* (2006.01)
(Continued)

(52) U.S. Cl.
CPC .............. *F25B 13/00* (2013.01); *H01L 23/473* (2013.01); *H01L 23/467* (2013.01); *F25B 23/006* (2013.01); *F25B 47/006* (2013.01);
(Continued)

(58) Field of Classification Search
CPC ............ F25B 2313/004; H01L 23/467; H01L 23/473
USPC .......................... 62/181, 183, 259.2, 505, 506; 361/679.46, 679.47, 679.52, 679.53, 361/688, 696, 701
See application file for complete search history.

(56) References Cited

U.S. PATENT DOCUMENTS 4,720,981 A * 1/1988 Helt et al. ......................... 62/113
5,220,809 A * 6/1993 Voss .............................. 62/259.2
(Continued)

FOREIGN PATENT DOCUMENTS

GB    2 253 037 A    8/1992
JP    62-069066 A    3/1987
(Continued)

OTHER PUBLICATIONS

JP 2007-139415 (English abstract).*
JP 10-111062 (English abstract).*
(Continued)

*Primary Examiner* — Jonathan Bradford
(74) *Attorney, Agent, or Firm* — Buchanan Ingersoll & Rooney PC

(57) ABSTRACT

An object of the present invention is to provide an air-conditioning apparatus that can effectively utilize heat energy generated by a control unit. In an air-conditioning apparatus in which a main heat source unit having a main compressor, a main four-way switching valve, and a main heat-source-side water-cooling heat exchanger and a use side load device having a throttle device and a use side heat exchanger are connected by a pipeline so as to constitute a refrigerant circuit that performs cooling/heating by switching a circulation path of a refrigerant by the main four-way switching valve, a main control unit that controls operations of at least the main compressor and the main four-way switching valve is disposed in the refrigerant circuit as an evaporator that exchanges heat generated by the main control unit with the refrigerant.

5 Claims, 4 Drawing Sheets

(51) Int. Cl.
 *F25B 23/00* (2006.01)
 *F25B 47/00* (2006.01)
 *H01L 23/473* (2006.01)
 *H01L 23/467* (2006.01)

(52) U.S. Cl.
 CPC .. *F25B 2313/004* (2013.01); *F25B 2313/0253* (2013.01); *F25B 2313/0315* (2013.01); *F25B 2700/13* (2013.01)

(56) References Cited

U.S. PATENT DOCUMENTS

| | | | |
|---|---|---|---|
| 6,116,040 A * | 9/2000 | Stark | 62/259.2 |
| 6,434,960 B1 * | 8/2002 | Rousseau | 62/228.4 |
| 6,604,372 B2 * | 8/2003 | Baumert et al. | 62/199 |
| 2008/0229769 A1 * | 9/2008 | Takegami et al. | 62/175 |

FOREIGN PATENT DOCUMENTS

| | | |
|---|---|---|
| JP | 63-052040 A | 4/1988 |
| JP | 4-369352 A | 12/1992 |
| JP | 6-034208 A | 2/1994 |
| JP | 2000-234767 A | 8/2000 |
| JP | 2001-355896 A | 12/2001 |
| JP | 2002-243205 A | 8/2002 |
| JP | 2005-069554 A | 3/2005 |

OTHER PUBLICATIONS

*International Search Report (PCT/ISA/210) issued on Jul. 7, 2009, by Japanese Patent Office as the International Searching Authority for International Application No. PCT/JP2009/056937.
The extended European Search Report issued on Apr. 22, 2014, by the European Patent Office in corresponding European Patent Application No. 09842667.9-1602. (4 pages).

* cited by examiner

AIR-CONDITIONING APPARATUS WITH A CONTROL UNIT OPERATING AS AN EVAPORATOR

TECHNICAL FIELD

The present invention relates to an air-conditioning apparatus that performs air conditioning of a target space. The present invention particularly relates to an air-conditioning apparatus that effectively utilizes heat energy generated in a control unit.

BACKGROUND ART

In an air-conditioning apparatus that performs air conditioning of a target space, means of the air-conditioning apparatus need to be controlled on the basis of the temperatures of a refrigerant, outside air and the like and pressure of the refrigerant and the like. Thus, a control unit (a controller) is usually disposed in a heat source unit (an outdoor unit, a heat-source-side unit) of the air-conditioning apparatus. This control unit consumes electric power by executing processing all the time during an operation of the heat source unit (air-conditioning apparatus) and also generates heat along with the operation. An example of a device in the control unit is an inverter device, for example.

The inverter device installed for changing a driving frequency in a compressor of the air-conditioning apparatus for variable-speed driving is a device having a large heat generation amount in the control unit that is caused by its operation. If the temperature of the inverter device is raised by heat generation, the inverter device might malfunction or be broken and thus, the inverter device needs to be cooled so as not to reach a high temperature. Here, the inverter device was used as an example, but the same applies to other electric devices. Hitherto, a heat sink or the like has been disposed in the control unit so that heat is emitted from the electric devices in the control unit to the heat sink and the electric devices in the control unit are cooled. Moreover, a cooling fan is used for blowing air and for cooling the heat sink, for example (See Patent Literature 1, for example).

CITATION LIST

Patent Literature

Patent Literature 1: Japanese Unexamined Patent Application Publication No. 62-69066 (FIG. 3)

SUMMARY OF INVENTION

Technical Problem

As described above, hitherto, the heat energy generated in the control unit has been dispersed into the air outside the heat source unit by the heat sink and the cooling fan.

The present invention is made to solve the problem that the waste heat energy of the control unit is dispersed as described above and an object thereof is to provide an air-conditioning apparatus that can effectively utilize the heat energy generated in the control unit. Moreover, an air-conditioning apparatus that can save energy related to its operation, improve efficiency of freezing preventing means of water pipelines and save energy related to heat-source unit standby electricity is provided.

Solution to Problem

An air-conditioning apparatus of the present invention is, in an air-conditioning apparatus in which a heat source unit having a compressor, a four-way switching valve, and a heat-source-side water-cooling heat exchanger, and a use side load device having a throttle device and a use side heat exchanger are connected by a pipeline so as to constitute a refrigerant circuit that performs cooling/heating by switching a circulation path of a refrigerant by the four-way switching valve, a control unit that controls operations of at least the compressor and the four-way switching valve is disposed in the refrigerant circuit as an evaporator that exchanges heat of heat energy generated by the control unit with the refrigerant.

Advantageous Effects of Invention

According to the air-conditioning apparatus according to the present invention, by using the control unit as the evaporator in the refrigerant circuit and by exchanging heat between the heat energy generated by processing of the control unit during a heating operation, for example, and the refrigerant, the refrigerant can be further made to absorb heat and evaporate. Thus, capacity relating to the heat exchange in the heat source unit can be improved, and power supplied to the compressor can be reduced so that power consumption during the heating operation can be reduced.

DESCRIPTION OF EMBODIMENTS

An air-conditioning apparatus of the present invention will be described below on the basis of the attached drawings.

Embodiment 1

Figure 1:
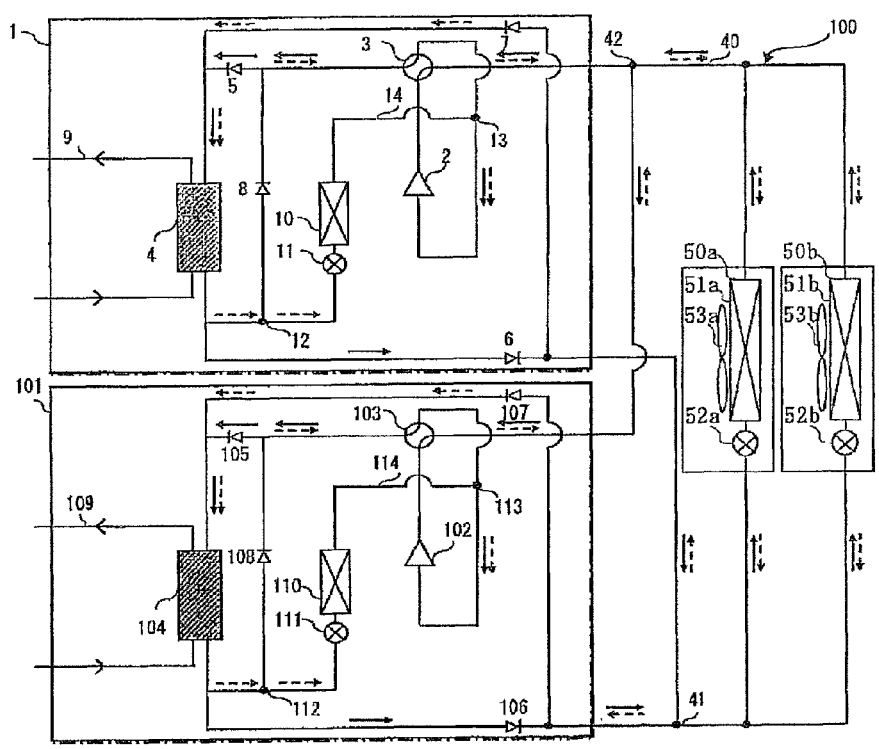
FIG. 1 is a diagram illustrating a configuration of an air-conditioning apparatus according to Embodiment 1.

FIG. 1 is a diagram illustrating a configuration of an air-conditioning apparatus 100 according to Embodiment 1 of the present invention. On the basis of FIG. 1, a circuit configuration of the air-conditioning apparatus 100 will be described. The air-conditioning apparatus 100 performs a cooling operation and a heating operation by using a refrigerating cycle (heat pump cycle) through which a refrigerant is circulated. Here, a plurality of heat source units are divided into a main unit and a sub unit for convenience in the following description.

As shown in FIG. 1, the refrigerating air-conditioning apparatus 100 of this embodiment constitutes a refrigerant circuit by connecting plural systems of heat source units (a main heat source unit 1 and a sub heat source unit 101) and two use side load devices 50 by refrigerant pipelines 40 composed of a liquid pipeline and a gas pipeline. Here, the two use side load devices 50 (50a and 50b) are connected in parallel with the two heat source units by the refrigerant pipelines 40. The refrigerant circulates through this refrigerant circuit and absorbs/radiates heat in the use side load devices 50a and 50b so that the refrigerating air-conditioning apparatus 100 can perform a cooling operation and a heating operation for a target space and the like. The use side load devices 50a and 50b and the like will be described by omitting suffixes if they are not particularly distinguished in the following.

Also, on the refrigerant pipeline 40, a liquid-side merging/branching portion 41 is disposed where liquid refrigerants (hereinafter referred to as liquid refrigerants. They may be gas-liquid two-phase refrigerants) from the heat source unit 1 and the sub heat source unit 101 merge during the cooling operation and the refrigerant branches to the main heat source unit 1 and the sub heat source unit 101 during the heating operation. Similarly, a gas-side merging/branching portion 42 is disposed on the refrigerant pipeline 40 where gas refrigerants (hereinafter referred to as gas refrigerants. They may be the gas-liquid two-phase refrigerants) branch to the main heat source unit 1 and the sub heat source unit 101 during the cooling operation and the refrigerants from the heat source unit 1 and the sub heat source unit 101 merge during the heating operation.

The main heat source unit 1 has a main compressor 2, a main four-way switching valve 3, a main water-cooling heat exchanger 4, main check valves 5, 6, 7, and 8 and a main control unit 10. The main compressor 2 sucks and compresses the refrigerant, makes the refrigerant be in a high temperature high pressure state, and discharges it. Here, the level of the pressure is not determined by a relationship with the reference pressure (numerical value). For example, it is assumed that the level is indicated on the basis of relative levels in the refrigerant circuit by means of pressurization of the main compressor 2 and the sub compressor 102, control of an open/closed state (opening degree) of each throttle device (flow controller) and the like. The same is assumed to apply to the temperature.

The main four-way switching valve 3 switches the flow of the refrigerant between the cooling operation and the heating operation. The main water-cooling heat exchanger 4 functions as a condenser during the cooling operation and functions as an evaporator during the heating operation. The main water-cooling heat exchanger 4 exchanges heat between water supplied from a main water pipeline 9 and the refrigerant and condenses and liquefies the refrigerant or evaporates and gasifies it. The main check valves 5, 6, 7, and 8 direct a flowing direction of the refrigerant at an outlet/inlet of the main water-cooling heat exchanger 4 so as to be in the main heat source unit 1.

The main control unit 10 is a device constituted by an inverter device and the like in order to control each device of the main heat source unit 1. Also, the main control unit 10 of this embodiment functions as an evaporator during the heating operation, exchanges heat with the refrigerant by heat energy generated by a processing operation (hereinafter referred simply as heat) and evaporates and gasifies the refrigerant in the refrigerant circuit. Thus, in this embodiment, in the refrigerant circuit, a bypass pipe in the main heat source unit 1 constitutes a main bypass circuit 14. At this time, one end of the bypass pipe (an outlet-side merging portion 12 of the main water-cooling heat exchanger) is connected to a pipeline from the main water-cooling heat exchanger 4 to the refrigerant pipeline 40 that becomes a liquid pipeline. Also, the other end (a suction-side merging portion 13 of the main compressor) is connected to a pipeline between the main four-way switching valve 3 and the suction side of the main compressor 2.

A throttle device 11 for a main bypass circuit is connected in series to the main control unit 10 by a pipeline. The throttle device 11 for a main bypass circuit functions as a decompression valve or an expansion valve and decompresses and expands the refrigerant. The throttle device 11 for a main bypass circuit is preferably constituted by means capable of changing an opening degree such as an electronic expansion valve. Here, a circuit by the refrigerant which passes through the main control unit 10 and the throttle device 11 for a main bypass circuit is assumed to be a main bypass circuit 14.

Also, the sub heat source unit 101 has the sub compressor 102, a sub four-way switching valve 103, a sub water-cooling heat exchanger 104, sub check valves 105, 106, 107, and 108, a sub control unit 110, and a throttle device 111 for a sub bypass circuit. The configuration of the sub heat source unit 101 is basically the same as that of the main heat source unit 1. The devices provided in the sub heat source unit 101 operate similarly to the corresponding devices of the main heat source unit 1 and function similarly.

On the other hand, the use side load device 50 has a use side heat exchanger 51, a use side throttle device 52, and an air blower 53. Here, in the use side load device 50, the use side heat exchanger 51 is connected in series to the use side throttle device 52 by a pipeline. The use side heat exchanger 51 functions as an evaporator during the cooling operation and functions as a condenser during the heating operation. The use side heat exchanger 51 exchanges heat between the refrigerant and air in a target space to be air-conditioned and evaporates and gasifies or condenses and liquefies the refrigerant. Also, the use side throttle device 52 functions as a decompression valve or an expansion valve so as to decompress and expand the refrigerant. The use side throttle device 52 is preferably constituted by means capable of changing the opening degree such as an electronic expansion valve. Also, the air blower 53 constituted by a fan and the like is disposed in the vicinity of the use side heat exchanger 51. The air blower 53 promotes heat exchange between the refrigerant and the air in the target space to be air-conditioned and feeds air into a room, for example. Here, description will be made assuming that the capacities (heat exchange capacities) relating to heat exchange in use side heat exchangers 51a and 51b of the use side load devices 50a and 50b are the same, but it is not limiting and the heat exchange capacities may be different from each other.

Here, the flow of the refrigerant and the like by the operation of the refrigerating air-conditioning apparatus 100 will be described. First, the flow of the refrigerant and the like in the case of the cooling operation indicated by a solid-line arrow in FIG. 1 will be described. A high temperature high pressure gas refrigerant discharged by the main compressor 2 of the main heat source unit 1 by compression flows into the main water-cooling heat exchanger 4 via the main four-way switching valve 3 and the main check valve 5. The gas refrigerant radiates heat by heat exchange with water supplied from the main water pipeline 9 in the main water-cooling heat exchanger 4 relating to inflow and enters into a low temperature high pressure liquid refrigerant state. Then, the liquid refrigerant having flowed out of the main heat exchanger 4 for water (main heat source unit 1) via the main check valve 6 reaches the liquid-side merging/branching portion 41 and merges with the liquid refrigerant from the sub heat source unit 101.

Also, in the sub heat source unit 101, too, as in the case of the main heat source unit 1, the high temperature high pressure gas refrigerant discharged by the sub compressor 102 flows into the sub water-cooling heat exchanger 104 via the sub four-way switching valve 103 and the sub check valve 105 and enters into a liquid refrigerant state. The liquid refrigerant flows out of the sub heat source unit 101 via the sub check valve 106, reaches the liquid-side merging/branching portions 41 and merges with the liquid refrigerant from the main heat source unit 101.

Subsequently, the liquid refrigerant having merged at the liquid-side merging/branching portion 41 flows into the use side load device 50, is decompressed while passing through the use side throttle device 52 and enters into a low temperature low pressure gas-liquid two-phase refrigerant state. After that, the gas-liquid two-phase refrigerant flows into the use side heat exchanger 51, absorbs heat by heat exchange with the air in the target space to be air-conditioned and enters into a mostly gas refrigerant state. This low-pressure gas refrigerant branches in the gas-side merging/branching portion 42 to the main heat source unit 1 side and the sub heat source unit 101 side.

The refrigerant having flowed into the main heat source unit 1 returns to (is sucked by) the main compressor 2 via the main four-way switching valve 3 and circulates through the refrigerant circuit again. Also, the refrigerant having flowed into the sub heat source unit 101 also returns to the sub compressor 102 via the sub four-way switching valve 103 similarly to the main heat source unit 1 side. As described above, the cooling operation of the refrigerating air-conditioning apparatus 100 is realized while the refrigerant changes its state by the operation performed by each device of the refrigerating air-conditioning apparatus 100 and circulates.

Subsequently, the flow of the refrigerant and the like in the case of the heating operation indicated by a broken-line arrow in FIG. 1 will be described. A high temperature high pressure gas refrigerant discharged by the main compressor 2 of the main heat source unit 1 reaches the gas-side merging/branching portion 42 via the main four-way switching valve 3 and merges with the gas refrigerant from the sub heat source unit 101. The high temperature high pressure gas refrigerant discharged by the sub compressor 102 of the sub heat source unit 101 also reaches the gas-side merging/branching portion 42 and merges with the gas refrigerant from the main heat source unit 1. Then, the merged gas refrigerant flows into the use side heat exchanger 51 of the use side load device 50. The gas refrigerant having flowed into the use side heat exchanger 51 radiates heat and condenses in the use side heat exchanger 51 by heat exchange with the air in the target space to be air-continued and enters into a low temperature high pressure liquid refrigerant state.

The liquid refrigerant having flowed out of the use side heat exchanger 51 is further decompressed when passing through the use side throttle device 52 and enters into a low-pressure gas-liquid two-phase refrigerant state. This gas-liquid two-phase refrigerant flows out of the use side load device 50, reaches the liquid-side merging/branching portion 41 as is and branches out to the main heat source unit 1 side and the sub heat source unit 101 side. The refrigerant having flowed to the main heat source unit 1 side flows into the main water-cooling heat exchanger 4 via the main check valve 7. In the main heat exchanger 4 for water, most of a liquid part of the gas-liquid two-phase refrigerant absorbs heat and is evaporated by heat exchange with water supplied from a main water pipeline 19. Then, the refrigerant flows through the main check valve 8 and the main four-way switching valve 3 side and the main bypass circuit 14 side, returns to the main compressor 2 and circulates through the refrigerant circuit again. Also, the refrigerant having flowed through the sub heat source unit 101 flows through the sub check valve 107 and the sub heat exchanger 104 for water similarly to the case of the main heat source unit 1 side. Then, the refrigerant flows through the sub check valve 108, the sub four-way switching valve 103 side and the sub bypass circuit 114 side and returns to the sub compressor 102.

Here, the refrigerant flowing through the main bypass circuit 14 (sub bypass circuit 114) side in the heating operation will be described. Here, the main bypass circuit 14 will be described. The gas-liquid two-phase refrigerant in which most of the liquid part has absorbed heat and been evaporated by passing through the main water-cooling heat exchanger 4 flows to the outlet-side merging portion 12 of the main water-cooling heat exchanger. Then, in the outlet-side merging portion 12 of the main water-cooling heat exchanger, the refrigerant branches to the main check valve 8 and main four-way switching valve 3 side and the main bypass circuit 14 side.

The refrigerant having flowed into the main control unit 10 via the throttle device 11 for a main bypass circuit further absorbs heat and is evaporated by heat exchange with the main control unit 10. Then, in the suction-side merging portion 13 of the main compressor, the refrigerant merges with the refrigerant having flowed form the main four-way switching valve 3 side. At this time, main control means adjusts the opening degree of the throttle device 11 for a main bypass circuit and regulates a refrigerant flow rate flowing to the main bypass circuit 14 side on the basis of the heat amount generated by the main control unit 10.

Also, similarly in the sub heat source unit 101, the refrigerant having branched to the sub bypass circuit 114 side absorbs heat and is evaporated by heat exchange with the sub control unit 110 and merges with the refrigerant having flowed from the sub four-way switching valve 103 side in the suction-side merging portion 113 of the sub compressor. At this time, sub control means adjusts the opening degree of the throttle device 11 for a main bypass circuit on the basis of a heat amount generated by the sub control unit 110.

As described above, according to the air-conditioning apparatus 100 of Embodiment 1, the main control unit 10 and the sub control unit 110 are used as evaporators in the refrigerant circuit, and heat is exchanged between heat generated by processing by the main control unit 10 and the sub control unit 110 and the refrigerant during the heating operation, the refrigerant can further absorb heat and be evaporated. Thus, the capacity relating to heat exchange in the main heat source unit 1 and the sub heat source unit 100 can be improved, the power supplied to the main compressor 2 and the sub compressor 102 can be reduced, and thus, power consumption during the heating operation can be reduced.

Embodiment 2

Figure 2:
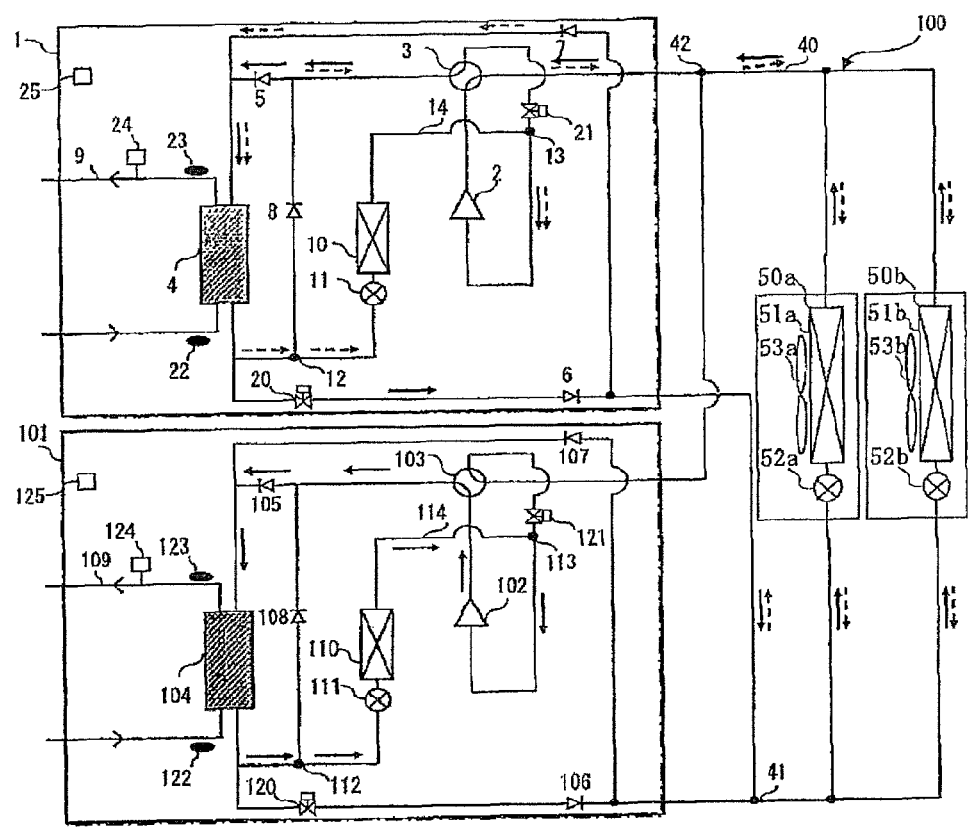
FIG. 2 is a diagram illustrating a configuration of an air-conditioning apparatus according to Embodiment 2.

FIG. 2 is a diagram illustrating a configuration of the air-conditioning apparatus 100 according to Embodiment 2 of the present invention. In FIG. 2, the devices and the like given the same reference numerals as those in FIG. 1 function similarly as described in Embodiment 1.

The main heat source unit 1 further has a main first opening/closing valve 20, a main second opening/closing valve 21, main water inlet temperature detecting means 22, main heat-source-unit-side circulation water outlet detecting means 23, main water quantity detecting means 24, and main anti-freezing control means 25.

The main first opening/closing valve 20 and the main second opening/closing valve 21 are disposed so as to limit the flow of the refrigerant by being closed when a anti-freezing operation is executed. The main water inlet temperature detecting means 22 and the main water outlet temperature detecting means 23 are constituted by temperature sensors such as thermistors or the like. The detecting means have a function of sending a signal that detects inlet/outlet temperatures of water circulating in the main water-cooling heat exchanger 4 through the main water pipeline 9 to the main anti-freezing control means 25. Here, the inlet water temperature is referred to as Twin and the outlet water temperature as Twout. Also, the main water quantity detecting means 24 is constituted by a flow meter and the like. They have a function of sending a signal that detects a water quantity Qw circulating in the main water-cooling heat exchanger 4 through the main water pipeline 9 to the main anti-freezing control means 25. Then, the main anti-freezing control means 25 executes judging processing and the like relating to the anti-freezing operation of water collecting in the main water-cooling heat exchanger 4 and the main water pipeline 9. Thus, signals are transmitted from the main water inlet temperature detecting means 22, the main water outlet temperature detecting means 23, and the main water quantity detecting means 24. Here, in this embodiment, the main anti-freezing control means 25 is constituted separately, but the processing and the like executed by the main anti-freezing control means 25 may be executed by the main control unit 10.

On the other hand, the configuration of the sub heat source unit 101 is basically the same as that of the main heat source unit 1. Thus, the sub heat source unit 101 further has, similarly to the main heat source unit 1, a sub first opening/closing valve 120, a sub second opening/closing valve 121, sub water inlet temperature detecting means 122, sub heat-source-unit-side circulation water outlet detecting means 123, sub water quantity detecting means 124, and sub anti-freezing control means 125. The devices provided in the sub heat source unit 101 operate similarly to the corresponding devices of the main heat source unit 1 and function similarly.

Here, water freezing when the heat source unit is stopped will be described using an example in which the main heat source unit 1 performs the heating operation and the sub heat source unit 101 is stopped, for example. The main heat source unit 1 and the sub heat source unit 101 operate or stop on the basis of the magnitude of a load in the use side load device 50 and perform air conditioning of the target space by controlling a heat amount supply by using the refrigerant. Here, in the main heat source unit 1 that performs the heating operation, water relating to the heat exchange needs to be supplied to and circulated through the main water-cooling heat exchanger 4. On the other hand, as for the stopped sub heat source unit 101, there is no need to circulate water through the sub water-cooling heat exchanger 104. Thus, water collects in the sub water-cooling heat exchanger 104 and the sub water pipeline 109 of the stopped sub heat source unit 101. If the ambient temperature of the sub heat source unit 101 is lowered in the winter, for example, the temperature of the water in the sub water-cooling heat exchanger 104 and the sub water pipeline 109 of the sub heat source unit 101 is lowered. Thus, the water in the sub water-cooling heat exchanger 104 and the sub water pipeline 109 freezes, which might result in breakage of the sub water-cooling heat exchanger 104 and the sub water pipeline 109.

Thus, in order to prevent freezing of the water in the sub water-cooling heat exchanger 104 and the sub water pipeline 109 of the sub heat source unit 101, the sub heat source unit 101 is operated similarly to the cooling operation so that the sub water-cooling heat exchanger 104 functions as a condenser. As a result, water absorbs heat from the refrigerant and its temperature is raised. However, since the main heat source unit 1 is performing the heating operation, the cooling operation of the sub heat source unit 101 preferably does not give a bad influence to the heating operation of the main heat source unit 1.

On the basis of the situation in the above description, the flow of the refrigerant in the sub heat source unit 101 during the anti-freezing operation will be described. During the anti-freezing operation, the sub anti-freezing control means 125 has the sub first opening/closing valve 120 and the sub second opening/closing valve 121 closed so that the refrigerant does not flow in or out of the refrigerant pipeline 40 side.

The high temperature high pressure gas refrigerant discharged from the sub compressor 102 flows into the sub water-cooling heat exchanger 104 via the sub four-way switching valve 103 and the sub check valve 105. The gas refrigerant passing through the sub water-cooling heat exchanger 104 radiates heat through heat exchange with water and enters into a low temperature and high pressure liquid refrigerant state. At this time, water absorbs heat and does not freeze. After that, the liquid refrigerant flows into the sub control unit 110 via the sub throttle device 111 for a bypass circuit and absorbs heat and is evaporated in the sub control unit 110. Then, the liquid refrigerant returns to the sub compressor 102 via the sub compressor suction-side merging portion 113.

Here, the case in which the main heat source unit 1 performs the heating operation and the sub heat source unit 101 is stopped is described, but the main heat source unit 1 operates similarly in the case in which the main heat source unit 1 is stopped and the sub heat source unit 101 performs the heating operation.

Figure 3:
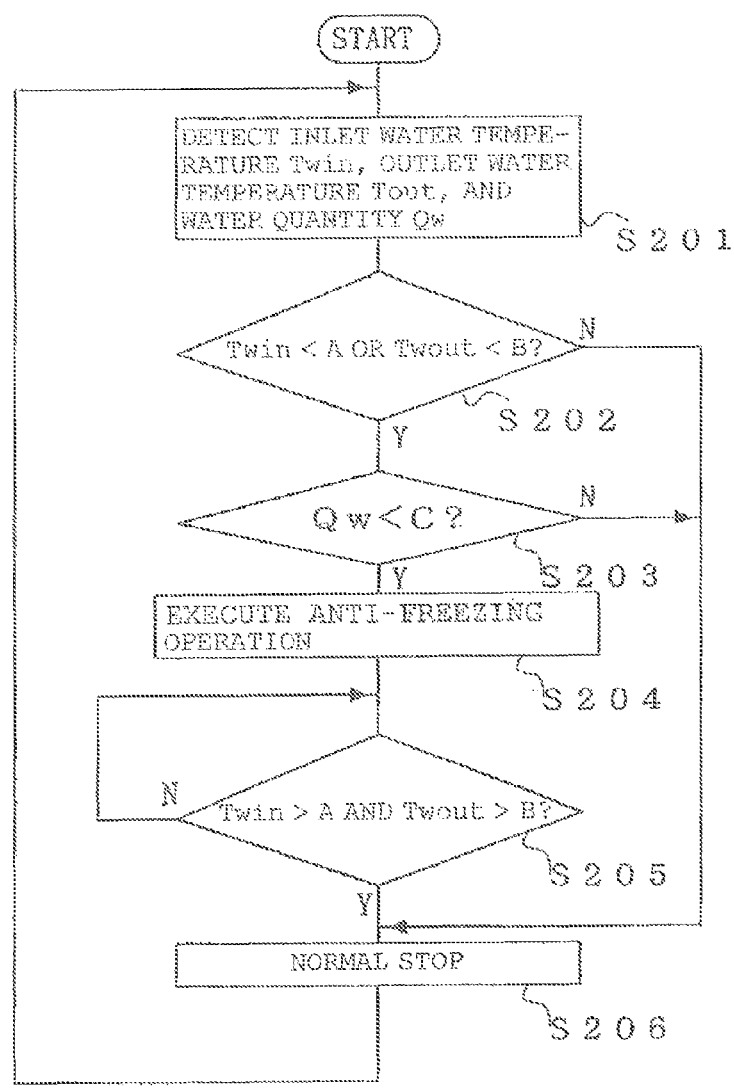
FIG. 3 is a diagram illustrating a flow chart indicating a flow of anti-freezing control according to Embodiment 2.

FIG. 3 is a diagram illustrating a flowchart indicating the flow of the judging processing executed by the main anti-freezing control means 25 and the sub anti-freezing control means 125 according to Embodiment 2 while the main heat source unit 1 and the sub heat source unit 100 are stopped. On the basis of FIG. 3, the judging processing on whether the anti-freezing control is to be executed or not by the main anti-freezing control means 25 and the sub anti-freezing control means 125 will be described. Here, the main anti-freezing control means 25 will be described, but the same applies to the sub anti-freezing control means 125.

First, on the basis of the signals transmitted from the main water inlet temperature detecting means 22, the main water outlet temperature detecting means 23, and the main water quantity detecting means 24, the inlet water temperature Twin, the outlet water temperature Twout, and the water quantity Qw are detected (Step S201). Then, it is determined whether or not at least one of the inlet water temperature Twin and the outlet water temperature Twout is smaller than predetermined values A and B set in advance, respectively (Step S202).

If it is determined that at least one of the inlet water temperature Twin and the outlet water temperature Twout is smaller than the predetermined values A and B (Step S202; YES), it is determined whether or not the main heat-source-unit side circulation water quantity Qw is smaller than a predetermined value C set in advance (Step S203). If it is determined that the main heat-source-unit side circulation water quantity Qw is smaller than a predetermined value C wet in advance (Step S203; YES), as described above, the anti-freezing operation for the water collecting in the main water-cooling heat exchanger 4 and the main water pipeline 9 is executed (Step S204). The execution of the anti-freezing operation is continued till the inlet water temperature Twin and the outlet water temperature Twout are both larger than the predetermined values A and B set in advance (Step S206; YES).

On the other hand, if it is determined that the inlet water temperature Twin and the outlet water temperature Twout are both larger than the predetermined values A and B set in advance (Step S202; NO), normal stoppage is continued (Step S205). Also, if it is determined that the water quantity Qw is larger than the predetermined value C set in advance (Step S203; NO), the normal stoppage is also continued (Step S205).

As described above, on the basis of the inlet water temperature Twin, the outlet water temperature Twout, and the water quantity Qw, collection and freezing of the water in the main water-cooling heat exchanger 4 and the main water pipeline 9 of the main heat source unit 1 are detected, and it is determined whether or not to execute the anti-freezing operation.

As described above, according to the air-conditioning apparatus 100 of Embodiment 2, the main anti-freezing control means 25, for example, detects the inlet water temperature Twin, the outlet water temperature Twout, and the water quantity Qw on the basis of the signals transmitted from the main water inlet temperature detecting means 22, the main water outlet detecting means 23, and the main water quantity detecting means 24, determines whether or not the anti-freezing operation is to be executed and if the anti-freezing operation is to be performed, by using the main water-cooling heat exchanger 4 as a condenser and the main control unit 10 as an evaporator, the refrigerant is circulated in the heat source unit 1 so as to prevent freezing by making water absorb heat, breakage of the main water-cooling heat exchanger 4 and the main water pipeline 9 is prevented, and operation reliability of the main heat source unit 1 can be improved. Also, since a heat retention specification in the main heat source unit 1 can be reduced, a cost can be reduced. This advantage can be also obtained by the sub heat source unit 100.

Embodiment 3

Figure 4:
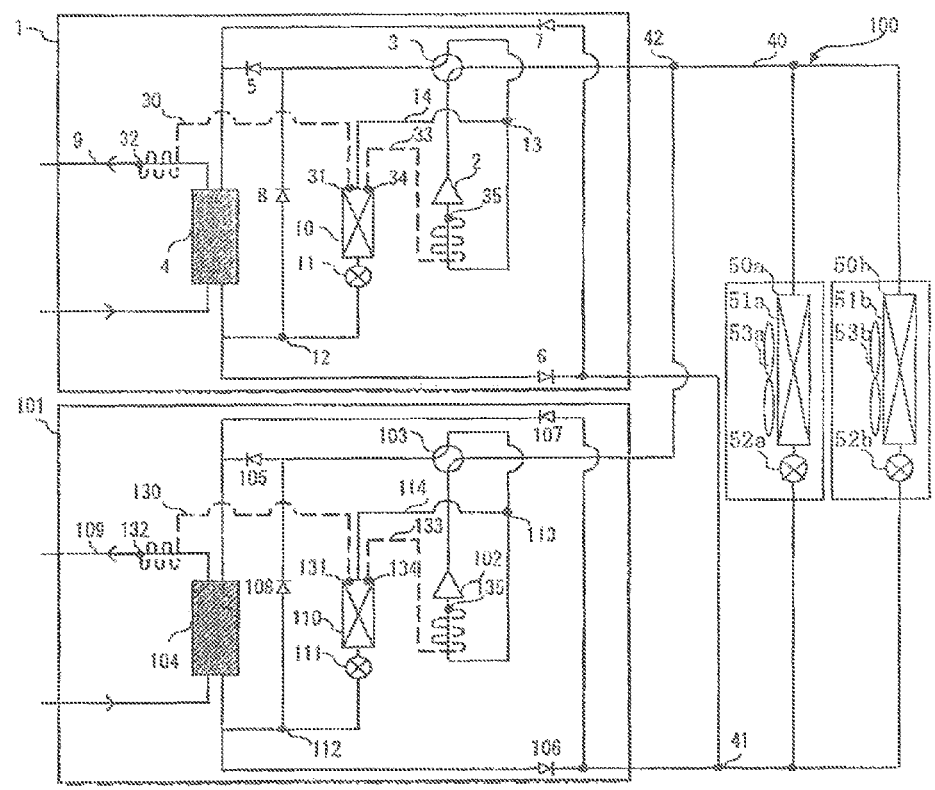
FIG. 4 is a diagram illustrating a configuration of an air-conditioning apparatus according to Embodiment 3.

FIG. 4 is a diagram illustrating the configuration of the air-conditioning apparatus 100 according to Embodiment 3 of the present invention. In FIG. 4, the devices and the like given the same reference numerals as those in FIG. 1 function similarly as described in Embodiment 1.

The main heat source unit 1 further has a main first heat pipe 30 and a main second heat pipe 33. In the main first heat pipe 30, one end 31 of the main first heat pipe is in contact with the main control unit 10 so that heat can transfer. Also, the other end 32 of the main first heat pipe is in contact with the main water pipeline 9. Then, in the main second heat pipe 33, too, one end 34 of the main second heat pipe is in contact with the main control unit 10. Also, the other end 35 of the main second heat pipe is in contact with the refrigerant pipeline on the suction side of the main compressor 2. Here, in the main first heat pipe 30 and the main second heat pipe 33, the channels are not shut off at the one ends and the other ends, and the refrigerant can be circulated through them. Also, here, the main first heat pipe 30 and the main second heat pipe 33 are constituted independently from the main refrigerant circuit through which the refrigerant is circulated between the heat source units and the use side load devices. However, the configuration is not limited by that, and they may be connected to the main refrigerant circuit in the vicinity of the main control unit 10 by a pipeline, for example, so that the refrigerants branch/merge.

On the other hand, the configuration of the sub heat source unit 101 is basically the same as the main heat source unit 1. Thus, the sub heat source unit 101 further has the main first heat pipe 30 and the main second heat pipe 33 similarly to the main heat source unit 1. Then, the devices provided with the sub heat source unit 101 operate similarly to the corresponding devices in the main heat source unit 1 and function similarly.

Here, an example in which the main heat source unit 1 is stopped due to lowered compressor oil concentration and water freezing while the heat source unit is stopped will be described. While the main heat source unit 1 is stopped, the refrigerant flows into the main compressor 2 side by a pressure difference of the refrigerants and is dissolved into a lubricant collecting in the main compressor 2. Thus, the lubricant can no longer function as a lubricant if the main compressor 2 is driven with lowered concentration (viscosity). And it results in damage on a sliding part or a failure of the compressor. Therefore, hitherto, a crankcase heater or the like was disposed at the bottom part of the compressor, for example, so as to prevent inflow of the refrigerant and temperature fall of the lubricant. In the case of water freezing in the main water pipeline 9, the description in Embodiment 2 also applies.

Then, in order to ensure concentration of the compressor oil and to prevent water freezing in the compressor, in this embodiment, heat generated from the main control unit 10 is absorbed through the main first heat pipe 30 and the main second heat pipe 33 so that the compressor oil and water temperatures are not lowered.

On the basis of the situation in the above description, an operation in the main heat source unit 1 while the operation is stopped will be described. Here, the main heat source unit 1 will be described but the sub heat source unit 1 also functions similarly if the sub heat source unit 101 is stopped.

Even if the operation of main heat source unit 1 is stopped, the main control unit 10 consumes power and generates heat. At this time, the refrigerant at the one end 31 of the main first heat pipe absorbs heat from the main control unit 10 and is evaporated. The evaporated refrigerant flows to the other end 32 of the main first heat pipe, exchanges heat with the main water pipeline 9, and radiates heat to the main water pipeline 9. By means of heat absorption of the main water pipeline 9, water freezing in the main water pipeline 9 and the main water-cooling heat exchanger 4 can be prevented. On the other hand, the refrigerant condensed by heat exchange flows to the one end 31 of the main first heat pipe again. The above circulation of the refrigerant is repeated in the main first heat pipe 30.

Also, in the main second heat pipe 33, too, the refrigerant at the one end 34 of the main second heat pipe absorbs heat from the main control unit 10 and is evaporated. The evaporated refrigerant flows to the other end 35 of the main second heat pipe, exchanges heat with the refrigerant pipeline on the suction side of the main compressor 1, and radiates heat. By means of heat absorption of the refrigerant pipeline, the temperature of the compressor oil is not lowered. On the other hand, the refrigerant condensed by heat exchange flows to the one end 34 of the main second heat pipe again. The above circulation of the refrigerant is repeated in the main second heat pipe 33. Here, if the heat generation amount of the main control unit 10 is not sufficient when the main heat source unit 1 is stopped, for example, a locked current is generated in the main compressor 2 so that the heat amount to the compressor oil can be ensured.

As described above, according to the air-conditioning apparatus 100 of Embodiment 3, by disposing the main first heat pipe 30, for example, the refrigerant is evaporated by heat generated by the main control unit 10 even if the main heat source unit 1 is stopped, for example, so that the main water pipeline 9 is heated by heat exchange between the evaporated refrigerant and the main water pipeline 9 at the other end 32 of the main first heat pipe, water freezing in the main water-cooling heat exchanger 4 and the main water pipeline 9 can be prevented. Thus, breakage of the main water-cooling heat exchanger 4 and the main water pipeline 9 can be prevented, and operation reliability of the main heat source unit 1 can be improved. Also, since temperature detecting means such as a thermistor, heat retaining means and the like having been disposed in the main water pipeline 5 as a measure against freezing can be reduced, a cost can be reduced.

Also, since the main second heat pipe 33 is disposed, for example, the refrigerant is evaporated by heat generated by the main control unit 10 even if the main heat source unit 1 is stopped, for example, and the refrigerant pipeline is heated by heat exchange between the evaporated refrigerant and the refrigerant pipeline on the suction side of the main compressor 1 at the other end 35 of the main second heat pipe, inflow of the refrigerant into the main compressor 2 and dissolution of the refrigerant into the lubricant under the influence of the ambient temperature while the main heat source unit 1 is stopped, for example, can be prevented, and a concentration fall of the lubricant can be prevented. Thus, the lubricant can exert a lubrication action while the main compressor 2 is driving, and the operation reliability of the main compressor 2 and the air-conditioning apparatus 100 can be improved. Also, since a crankcase heater having been disposed at the bottom part of the main compressor 2 as a measure against lowered oil concentration can be eliminated, a cost and standby electricity of the heat source unit can be reduced. This advantage can be also obtained on the sub heat source unit 100 side.

Embodiment 4

In Embodiments 1 to 3 described above, the air-conditioning apparatus 100 provided with the two heat source units, that is, the main heat source unit 1 and the sub heat source unit 101, is described as an example, but the number of heat source units is not limited in the present invention. Three or more heat source units, for example, may be disposed. Depending on the case, one heat source unit can exert the above advantages.

Also, in Embodiments 1 to 3, the case in which the use side load device 50 is provided with the two use side load devices 50a and 50b is described, but the number of use side load devices 50 is not limited in the present invention. Three or more use side devices 50, for example, may be disposed or there may be one use side load device 50.

REFERENCE SIGNS LIST 1 main heat source unit, 2 main compressor, 3 main four-way switching valve, 4 main water-cooling heat exchanger, 5, 6, 7, 8 main check valve, 9 main water pipeline, 10 main control unit, 11 throttle device for a main bypass circuit, 12 main water-cooling heat exchanger outlet-side merging portion, 13 main compressor suction-side merging portion, 14 main bypass circuit, 20 main first opening/closing valve, 21 main second opening/closing valve, 22 main water inlet temperature detecting means, 23 main water outlet temperature detecting means, 24 main water quantity detecting means, 25 main anti-freezing control means, 30 main first heat pipe, 31 one end of main first heat pipe, 32 the other end of main first heat pipe, 33 main second heat pipe, 34 one end of main second heat pipe, 35 the other end of main second heat pipe, 40 refrigerant pipeline, 41 liquid-side merging portion, 42 gas-side merging portion, 50, 50a, 50b use side load device, 51, 51a, 51b use side heat exchanger, 52, 52a, 52b use side throttle device, 53, 53a, 53b air blower, 100 air-conditioning apparatus, 101 sub heat source unit, 102 sub compressor, 103 sub four-way switching valve, 104 sub water-cooling heat exchanger, 105, 106, 107, 108 sub check valve, 109 sub water pipeline, 110 sub control unit, 111 sub throttle device for bypass circuit, 112 sub water-cooling heat exchanger outlet-side merging portion, 113 sub compressor suction side merging portion, 114 sub bypass circuit, 120 sub first opening/closing valve, 121 sub second opening/closing valve, 122 sub water inlet temperature detecting unit, 123 sub water outlet temperature detecting means, 124 sub water quantity detecting means, 125 sub anti-freezing control means, 130 sub first heat pipe, 131 one end of sub first heat pipe, 132 the other end of sub first heat pipe, 133 sub second heat pipe, 134 one end of sub second heat pipe, 135 the other end of sub second heat pipe.

The invention claimed is:

1. An air-conditioning apparatus in which a heat source unit having a compressor, a four-way switching valve, and a heat-source-side water heat exchanger, and a use side load device having a throttle device and a use side heat exchanger are connected by a pipeline so as to constitute a refrigerant circuit that performs cooling/heating by switching a circulation path of a refrigerant by the four-way switching valve, wherein:
a control unit that controls operations of at least the compressor and the four-way switching valve is disposed in the refrigerant circuit as an evaporator that exchanges heat generated by the control unit with the refrigerant;
the heat source unit is further provided with
a first opening/closing valve and a second opening/closing valve that limit inflow/outflow of the refrigerant to/from the heat source unit,
water inlet temperature detecting means that detects a temperature of water flowing into the heat-source-side water heat exchanger,
water outlet temperature detecting means that detects a temperature of water flowing out of the heat-source-side water heat exchanger,
water quantity detecting means that detects a flow rate of the water flowing through the heat-source-side water heat exchanger, and
anti-freezing control means that compares the water temperatures according to detection of the water inlet temperature detecting means and the water outlet temperature detecting means and the water flow rate according to detection of the water quantity detecting means with predetermined values respectively and determines whether or not a water anti-freezing operation is to be performed and, upon determination that the anti-freezing operation is to be performed
the anti-freezing control means performs the water anti-freezing operation including:
closing the first opening/closing valve and the second opening/closing valve, and
using the heat-source-side water heat exchanger as a condenser and the control unit as an evaporator.

2. The air-conditioning apparatus of claim 1, wherein the control unit is disposed on a bypass pipeline that connects a pipeline from the heat-source-side water heat exchanger to the throttle device and a pipeline that connects the four-way switching valve and the suction side of the compressor.

3. The air-conditioning apparatus of claim 1, wherein the anti-freezing control means performs the water anti-freezing operation until the anti-freezing control means determines that the water temperatures according to detection of the water inlet temperature detecting means and the water outlet temperature detecting means reach the predetermined values or more.

4. The air-conditioning apparatus of claim 1, wherein the heat source unit is further provided with a heat pipe whose one end is connected to the control unit by a pipeline and the other end contacts with a water pipeline that supplies water to the heat-source-side water heat exchanger so that the refrigerant evaporated by heat generated by the control unit is condensed by heat exchange with the water pipeline.

5. The air-conditioning apparatus of claim 1, wherein the heat source unit is further provided with a second heat pipe whose one end is connected to the control unit by a pipeline and the other end contacts with a suction-side refrigerant pipeline that connects to the suction side of the compressor so that the refrigerant evaporated by heat generated by the control unit is condensed by heat exchange with the suction-side refrigerant pipeline.

* * * * *